(12) United States Patent
Chang et al.

(10) Patent No.: US 8,189,406 B2
(45) Date of Patent: May 29, 2012

(54) DEVICE AND METHOD GENERATING INTERNAL VOLTAGE IN SEMICONDUCTOR MEMORY DEVICE

(75) Inventors: Soo-Bong Chang, Seoul (KR);
Doo-Young Kim, Seongnam-si (KR);
Jung-Im Huh, Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 12/978,677

(22) Filed: Dec. 27, 2010

(65) Prior Publication Data

US 2011/0090746 A1    Apr. 21, 2011

Related U.S. Application Data

(63) Continuation of application No. 12/372,290, filed on Feb. 17, 2009, now Pat. No. 7,864,599.

(30) Foreign Application Priority Data

Feb. 15, 2008   (KR) .................. 10-2008-0013910

(51) Int. Cl.
*G11C 5/14* (2006.01)
(52) U.S. Cl. ............ 365/189.09; 365/226; 365/229; 365/203; 365/196; 365/207
(58) Field of Classification Search ............ 365/189.09, 365/226, 229, 203, 196, 207, 185.25
See application file for complete search history.

(56) References Cited

U.S. PATENT DOCUMENTS

| 6,496,446 | B2 | 12/2002 | Suzuki |
| 7,864,599 | B2* | 1/2011 | Chang et al. ............ 365/189.09 |
| 2006/0140018 | A1* | 6/2006 | Do ........................ 365/189.09 |

FOREIGN PATENT DOCUMENTS

| JP | 2006252721 A | 9/2006 |
| KR | 100273274 B1 | 9/2000 |
| KR | 1020030047013 A | 6/2003 |
| KR | 1020070036633 A | 4/2007 |

* cited by examiner

*Primary Examiner* — Thong Q Le
(74) *Attorney, Agent, or Firm* — Volentine & Whitt, PLLC

(57) ABSTRACT

A semiconductor memory device and a method of generating an internal voltage in the semiconductor memory device are provided. The semiconductor memory device includes a controller configured to activate a sensing enable signal when an active command is applied from outside, inactivate the sensing enable signal when a precharge command is applied, and output the sensing enable signal, and an array internal voltage generator configured to output an active array power supply voltage as an array power supply voltage when the sensing enable signal is activated, output an external array power supply voltage and a standby array power supply voltage as the array power supply voltage when the sensing enable signal is inactivated, and output the standby array power supply voltage alone as the array power supply voltage when the sensing enable signal is inactivated for at least a specific period.

13 Claims, 5 Drawing Sheets

DEVICE AND METHOD GENERATING INTERNAL VOLTAGE IN SEMICONDUCTOR MEMORY DEVICE

CROSS-REFERENCE TO RELATED APPLICATION

This application is a continuation application of application Ser. No. 12/372,290 (now U.S. Pat. No. 7,864,599) filed on Feb. 17, 2009, which claims the benefit of Korean Patent Application No. 10-2008-0013910 filed Feb. 15, 2008, the subject matter of which is hereby incorporated by reference.

BACKGROUND

The invention relates to semiconductor memory devices and a method of generating an internal voltage within said devices. More particularly, the invention relates to semiconductor memory devices capable of performing an overdriving operation with reduced noise and a method of generating an internal voltage in said semiconductor memory devices.

Semiconductor memory devices are constantly being made to have higher integration density, lower power consumption and higher data processing rates. As a result, the size of the various components forming semiconductor memory devices are reduced and power supply voltages applied during the operation are decreased. Thus, there is a continuing demand for various technologies that collectively cooperate to fabricate increasingly small semiconductor memory devices capable of operating at higher speed with relatively lower applied operating voltage(s). A sense-amplifier overdriving technique is one such technology.

In order to assure relatively low power consumption, most conventional semiconductor memory devices have an internal power supply voltage generation circuit receiving an external power supply voltage and generating a lower internal power supply voltage. It should be noted that conventional semiconductor memory devices use a plurality of different internal power supply voltages for various purposes. One of the internal power supply voltages supplied to a memory cell array is referred to as an array power supply voltage.

Figure (FIG.) 1 is a circuit diagram of a memory cell array of a semiconductor memory device.

When a word line WL selected by a row address is activated in the semiconductor memory device, data from a plurality of memory cells MC connected with the word line WL is transferred to a pair of bit lines BL and /BL. When sense amplifier drivers MP and MN, turned ON in response to a P sensing signal (pse) and an N sensing signal (nse), they respectively supply an array power supply voltage VINTA and an array ground voltage (VSSA) to a sense amplifier power supply line RTO and a sense amplifier ground line /S. A plurality of sense amplifiers SA are activated and operate in relation to a voltage difference between the pair of bit lines BL and /BL. As typically implemented, a large number of sense amplifiers SA operate simultaneously. Thus, it is difficult to amplify data from a large number of cells during a short period of time when the array power supply voltage (VINTA) is applied as a conventional internal array power supply voltage having a relatively low level. In other words, the bit line sensing speed of the foregoing device decreases in relation to the quantity of data being processed, and ultimately the semiconductor memory device cannot operate at a sufficiently high speed.

In addition to the foregoing limitation, the size of a metal-oxide semiconductor (MOS) transistor implementing the sense amplifier is inevitably reduced as the overall semiconductor memory device is fabricated with a higher degree of device integration. When the size of an MOS transistor of the sense amplifiers SA is reduced, it is efficient to reduce the size of p-type MOS (PMOS) transistors SP1 and SP2 which are generally formed larger than the n-type MOS (NMOS) transistors SN1 and SN2 because their inherent current driving capability is small. However, when the size of the PMOS transistors SP1 and SP2 decreases, it is difficult for the sense amplifiers SA to properly amplify data to a sufficiently high level.

To address the above-mentioned problems, a method is used which supplies an external array power supply voltage (VCCA) having a higher level than an internal array power supply voltage (IVCA) as the array power supply voltage (VINTA) to the sense amplifier power supply line RTO for a specific period of time as the sense amplifiers SA begin operation to thereby drive the sense amplifiers SA. This approach is commonly referred to as sense amplifier overdriving. That is, the sense amplifiers SA receive the external array power supply voltage (VCCA) as the array power supply voltage (VINTA) through the sense amplifier power supply line RTO during an overdriving operation, and the internal array power supply voltage (IVCA) as the array power supply voltage (VINTA) during a sensing operation.

SUMMARY

Embodiments of the invention provide an internal voltage generator within a semiconductor memory device that activates an overdriving signal in response to a precharge command and lengthens an overdriving period such that the semiconductor memory device operates more stably. Embodiments of the invention also provide an overdriving method adapted for use within a semiconductor memory device.

In one embodiment, a semiconductor memory device comprises; a controller configured to activate a sensing enable signal when an active command is applied, inactivate the sensing enable signal when a precharge command is applied, and output the sensing enable signal, and an array internal voltage generator configured to output an active array power supply voltage as an array power supply voltage when the sensing enable signal is activated, output an external array power supply voltage and a standby array power supply voltage as the array power supply voltage when the sensing enable signal is inactivated, and output the standby array power supply voltage as the array power supply voltage when the sensing enable signal is inactivated for at least a specific period.

In another embodiment, a method of generating an internal power supply voltage in a semiconductor memory device comprises; a sensing enable signal generation step of activating a sensing enable signal when an active command is applied from outside, inactivating the sensing enable signal when a precharge command is applied, and outputting the sensing enable signal, an active step of outputting an active array power supply voltage as an array power supply voltage when the sensing enable signal is activated, an overdriving step of outputting an external array power supply voltage and a standby array power supply voltage as the array power supply voltage when the sensing enable signal is inactivated, and a standby step of outputting the standby array power supply voltage as the array power supply voltage when the sensing enable signal is inactivated for at least a specific time.

BRIEF DESCRIPTION OF THE DRAWINGS

Embodiments of the invention are described in some additional detail below with reference to the accompanying drawings. It should be understood that various aspects of the drawings may have been exaggerated for clarity.

DESCRIPTION OF EMBODIMENTS

Various example embodiments will now be described more fully with reference to the accompanying drawings. However, the invention may be variously embodied and should not be construed as being limited to only the illustrated embodiments. Throughout the drawings and written description, like reference symbols and numbers refer to like or similar elements.

It will be understood that, although the terms first, second, etc. may be used herein, they are used only to distinguish one element from another, not to limit elements in any way. The terms first and second could be interchanged with respect to a given element without departing from the scope of the present invention. Also, the term "and/or" picks out each individual item as well as all combinations of them.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe relationships between elements should be interpreted in a like fashion (e.g., "between" versus "directly between," "adjacent" versus "directly adjacent," etc.).

Terms used in this specification are not intended to limit the example embodiments of the invention. Elements referred to in the singular are to be interpreted as possibly being plural unless stated otherwise. In addition, the terms "comprise," "comprising," "include" and "including" do not exclude the existence or addition of at least one component, step and/or device other than those mentioned.

An overdriving apparatus and method of a semiconductor memory device according to example embodiments of the inventive concept will be described in detail below with reference to the accompanying drawings.

Figure 1:
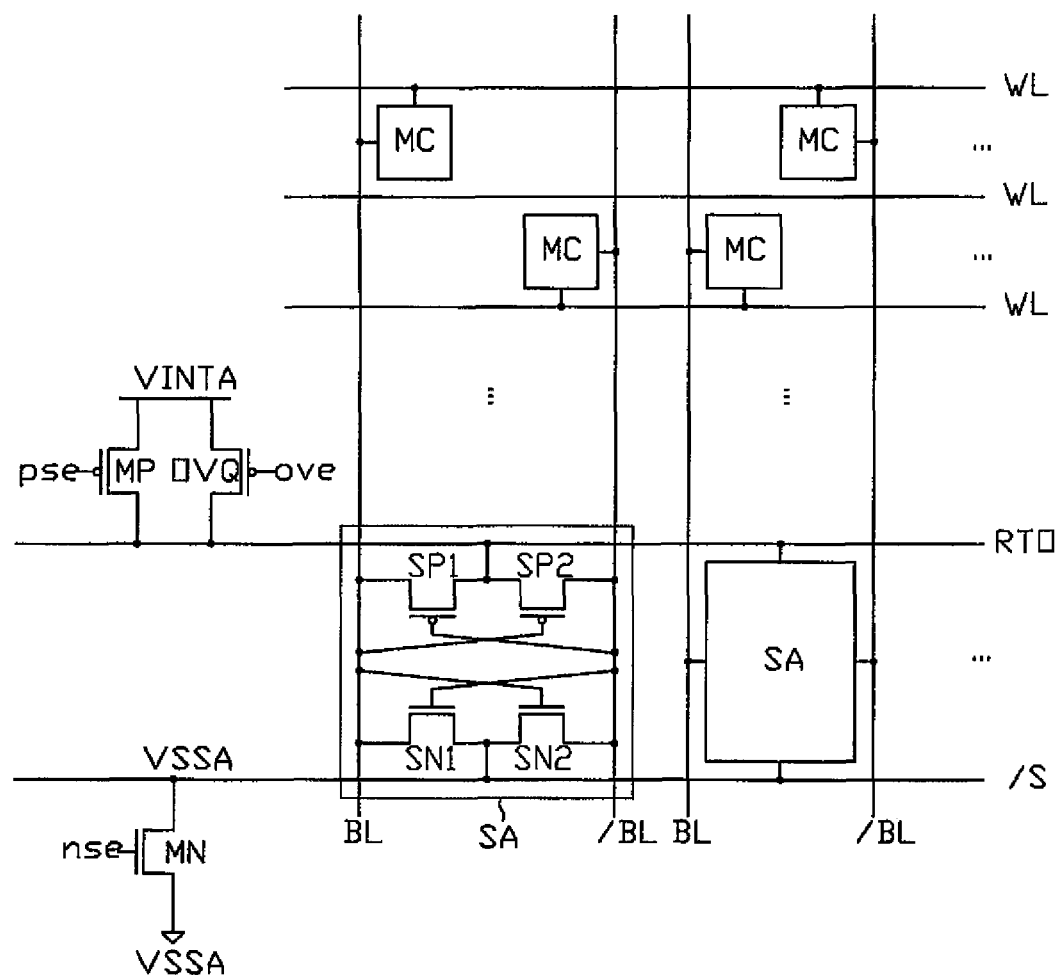
FIG. 1 is a circuit diagram of a memory cell array of a semiconductor memory device.
Figure 2:
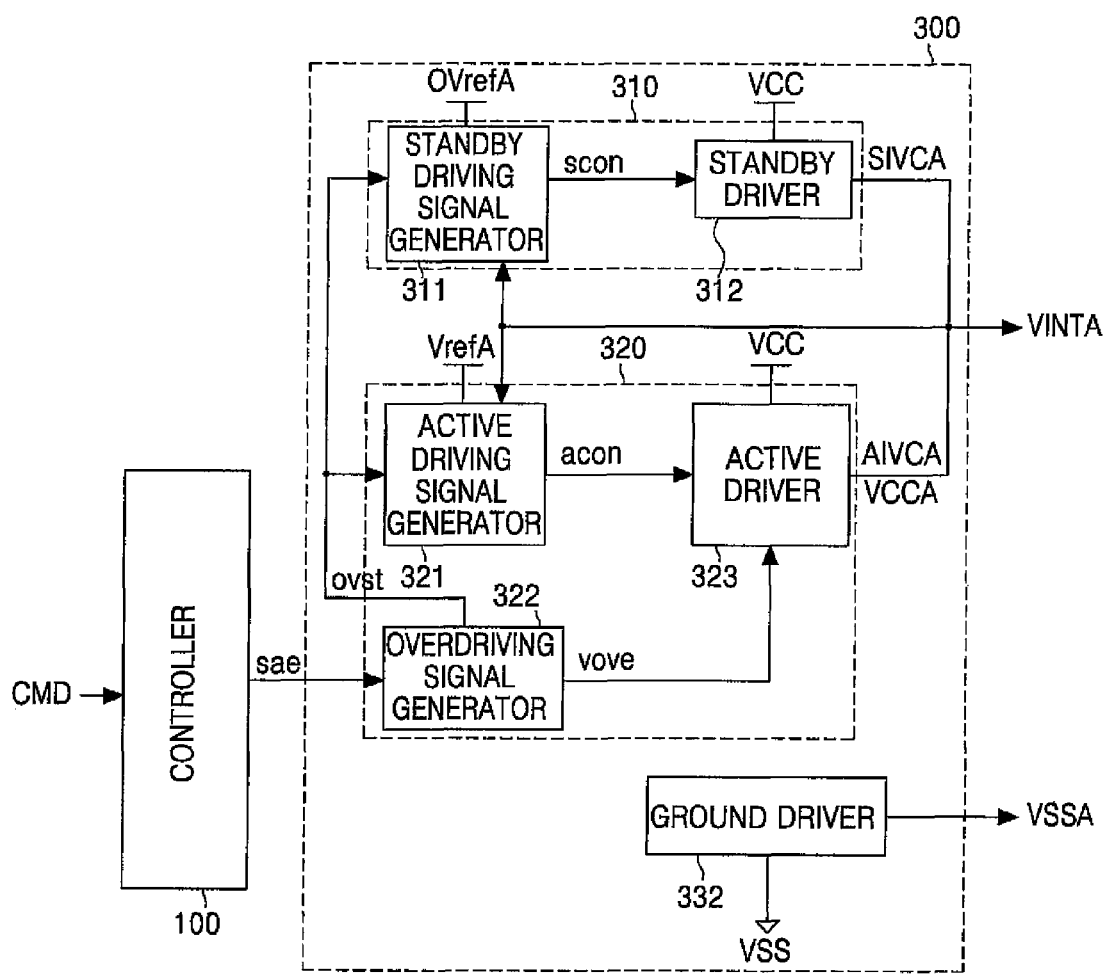
FIG. 2 is a block diagram of an internal voltage generator of a semiconductor memory device according to an embodiment of the invention.
Figure 3:
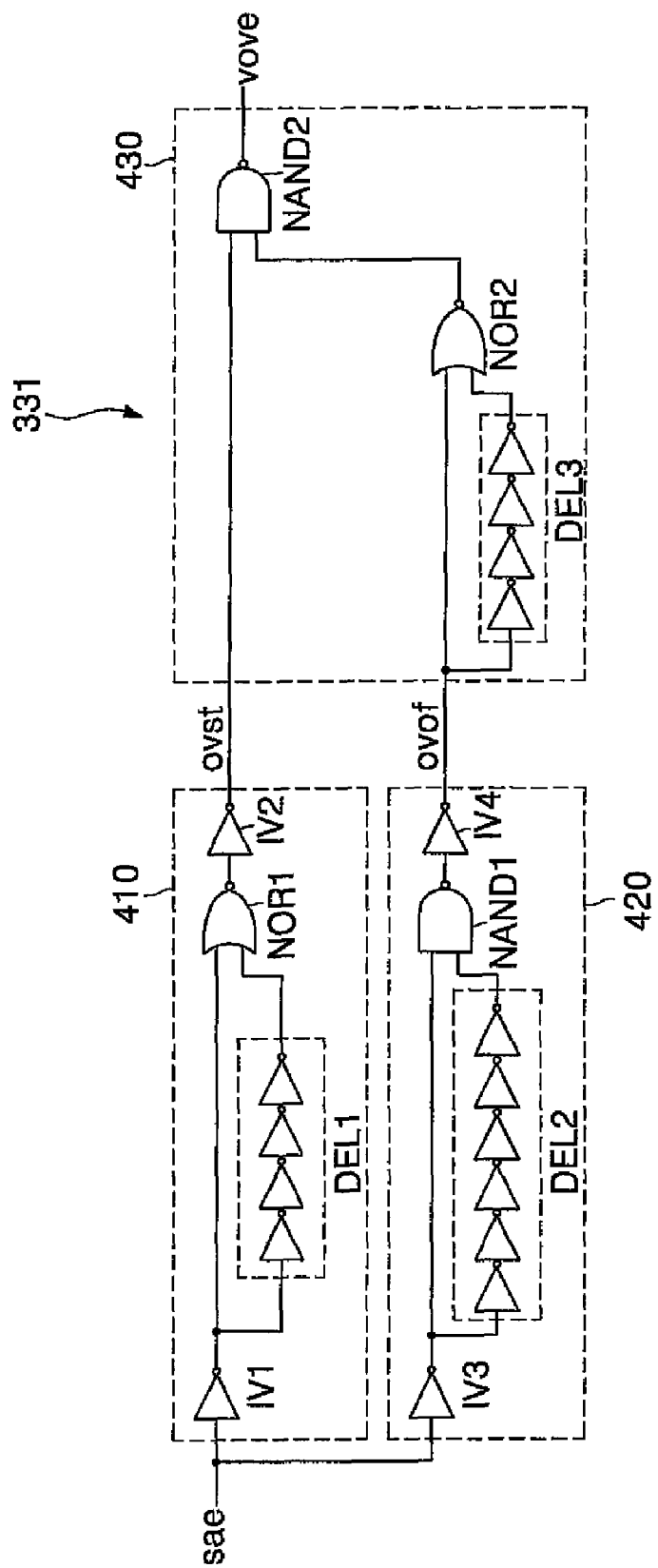
FIG. 3 is a circuit diagram further illustrating one possible embodiment of the overdriving signal generator of FIG. 2.

FIG. 2 is a block diagram of an internal voltage generator for a semiconductor memory device according to an embodiment of the invention. FIG. 3 is a circuit diagram further illustrating one possible embodiment of the overdriving signal generator of FIG. 2. Referring collectively to FIGS. 2 and 3, a controller 100 receives an externally provided command (CMD), and outputs a sensing enable signal (sae) in response to the received command. The controller 100 activates the sensing enable signal when the received command is an active command (e.g., a read/write command), but inactivates the sensing enable signal when the received command CMD is a non-active command such as a precharge command.

An array internal voltage generator 300 includes a standby power supply voltage generator 310, an active power supply voltage generator 320 and a ground driver 332, and supplies an array power supply voltage (VINTA) and an array ground voltage (VSSA) to the memory cell array.

The standby power supply voltage generator 310 includes a standby driving signal generator 311 and a standby driver 312. In response to the overdriving start signal (ovst), the standby driving signal generator 311 compares an overdriving array reference voltage (OVrefA) applied from a reference voltage generator (not shown) with the array power supply voltage and outputs a standby control signal (scon). The standby driver 312 adjusts the level of an external power supply voltage (VCC) and generates the standby array power supply voltage (SIVCA) as the array power supply voltage in response to the standby control signal.

Here, the standby power supply voltage generator 210 is included to supply the array power supply voltage to the memory cell array during a standby operation, and thus is designed to have a relatively small driving capability.

The active power supply voltage generator 320 includes an active driving signal generator 321, an overdriving signal generator 322 and an active driver 323. During an active operation, the semiconductor memory device requires more current than during the standby operation. Therefore, the active power supply voltage generator 320 has a relatively large driving capability to supply sufficient current to the memory cell array during an active operation. The active driving signal generator 321 outputs an active control signal (acon) in response to the overdriving start signal. And, in response to the active control signal and an overdriving enable signal (vove), the active driver 223 adjusts the level of the external power supply voltage and generates an active array power supply voltage (AIVCA).

In the active power supply voltage generator 320, an overdriving signal generator 322 receives the sensing enable signal. The overdriving signal generator 322 includes an overdriving start signal generator 410, an overdriving end signal generator 420 and an overdriving enable signal generator 430.

The overdriving start signal generator 410 generates the overdriving start signal in response to the sensing enable signal. The overdriving start signal generator 410 includes an inverter IV1 that inverts the sensing enable signal, a delay unit DEL1 that delays the inverted sensing enable signal by a first delay period, a NOR gate NOR1 that receives the inverted sensing enable signal and the inverted and delayed sensing enable signal and performs a logical NOR operation on the two signals, and an inverter IV2 that inverts an output signal of the NOR gate NOR1 to output the overdriving start signal. The number of delay elements in the delay unit DEL1 may be adjusted such that the overdriving start signal can be immediately activated when the sensing enable signal is activated, and inactivated after the first delay period when the sensing enable signal is inactivated.

The overdriving end signal generator 420 generates an overdriving end signal (ovof) to inactivate the overdriving enable signal after a specific period of time when a precharge period tRP, during which the sensing enable signal is inactivated, is too long. The overdriving end signal generator 420 includes an inverter IV3 that inverts the sensing enable signal, a delay unit DEL2 that delays the inverted sensing enable signal by a second delay period, a NAND gate NAND1 that receives the inverted sensing enable signal and the inverted and delayed sensing enable signal and performs a logical NAND operation on the two signals, and an inverter IV4 that inverts an output signal of the NAND gate NAND1 to output the overdriving end signal.

An overdriving operation supplies an external array power supply voltage (VCCA), which is higher than a standby array power supply voltage (SIVCA) or an active array power supply voltage (AIVCA) as the array power supply voltage (VINTA) generally supplied to the memory cell array of the semiconductor memory device. Thus, as an overdriving period (VOVP) is extended, an overshoot may occur in the memory cell array. Therefore, in relation to the precharge period tRP, as defined by a period from application of a precharge command PRE to the application of an active command ACT, the overdriving operation must be finished within a specific period.

Consequently, in the overdriving end signal generator 420, the number of delay elements of the delay unit DEL2 may be adjusted to determine a time after the sensing enable signal is inactivated until overdriving is finished. As a result, the overdriving end signal is activated after the second delay period when the sensing enable signal is inactivated, and is immediately inactivated when the sensing enable signal is activated.

The overdriving enable signal generator 430 generates the overdriving enable signal in response to the overdriving start signal and the overdriving end signal. The overdriving enable signal generator 430 includes a delay unit DEL3 that delays the overdriving end signal by a third delay period, a NOR gate NOR2 that receives the overdriving end signal and the delayed overdriving end signal and performs a logical NOR operation on the two signals, and an NAND gate NAND2 that performs a logical NAND operation on an output signal of the NOR gate NOR2 and the overdriving start signal to output the overdriving enable signal. Here, the overdriving start signal is activated after a specific delay time following the activation of the sensing enable signal, and the overdriving end signal is immediately inactivated when the sensing enable signal is activated. Therefore, the delay unit DEL3 delays the overdriving end signal by the third delay period to prevent the overdriving enable signal from being activated for a specific time between the inactivation of the overdriving end signal, performed immediately after the sensing enable signal is activated, and the activation of the overdriving start signal.

As described above, in the internal voltage generator according to the illustrated embodiment, the overdriving enable signal is set to finish overdriving before an active command is applied when the precharge period tRP is long, thereby preventing overshoot in the memory cell array. However, when the overdriving period (VOVP) is stopped before a sensing operation due to the long precharge period tRP, the level of the overdriven voltage (VCCA) is gradually reduced by leakage current. Therefore, when overdriving is finished before the sensing operation, additional power must be supplied such that the memory cell array can maintain the level of the overdriven voltage. Since the voltage level to be maintained is the level of the external array power supply voltage (VCCA), a standby driving signal generator 311 receives an overdriving array reference voltage (OVrefA) having a higher level than the array reference voltage (VrefA) and generates the standby array power supply voltage (SIVCA). On the other hand, an active driving signal generator 321 receives the array reference voltage and generates the active array power supply voltage. Therefore, the standby array power supply voltage has a higher level than the active array power supply voltage and can maintain the overdriven voltage level of the memory cell array. Here, the overdriving array reference voltage has a lower level than the external array power supply voltage. This is because overshoot may occur in the memory cell array, like in the overdriving operation, when the standby array power supply voltage has the same level as the external array power supply voltage.

Meanwhile, the standby array power supply voltage has a higher level than the active array power supply voltage, and thus the standby array power supply voltage must not be applied to the memory cell array when the semiconductor memory device is in the active operation. Therefore, the standby driving signal generator 311 receives the overdriving start signal and is activated or inactivated in accordance with the overdriving start signal. The active driving signal generator 321 also receives the overdriving start signal, but is configured to be inactivated when the overdriving start signal is activated, and activated when the overdriving start signal is inactivated. However, the active driving signal generator 321 may be activated after receiving the sensing enable signal from the controller 100. Also, the standby driving signal generator 311 may be activated after receiving the sensing enable signal from the controller 100.

Figure 4:
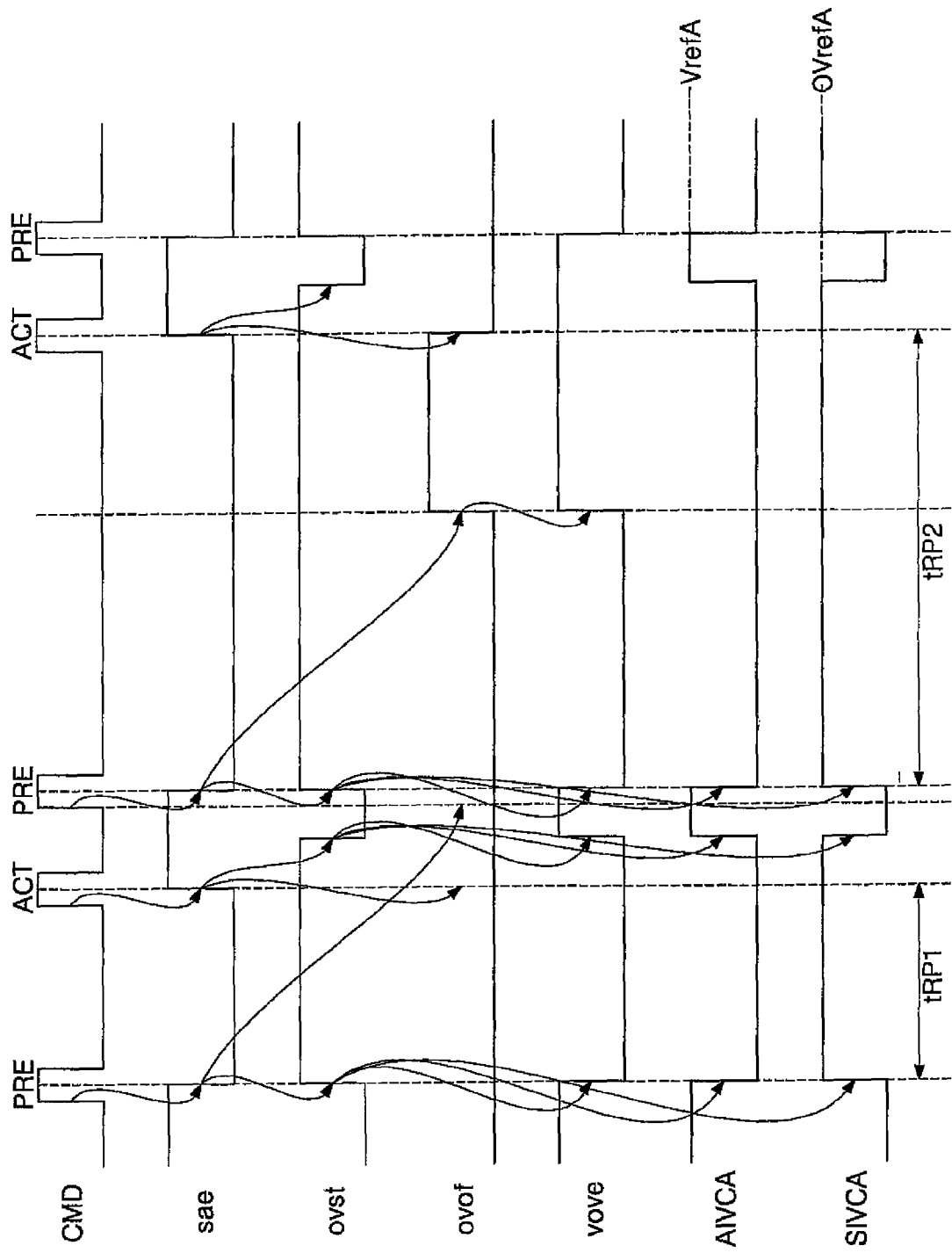
FIG. 4 is a timing diagram further illustrating the operation of the internal voltage generator of FIG. 2.

FIG. 4 is a timing diagram further illustrating the operation of the internal voltage generator of FIG. 2. First, when the precharge command PRE is applied, the controller 100 inactivates the sensing enable signal (sae). In response to the inactivated sensing enable signal, the overdriving start signal generator 410 of the overdriving signal generator 322 immediately activates the overdriving start signal (ovst). In response to the activated overdriving start signal, the overdriving enable signal generator 430 activates the overdriving enable signal (vove). Likewise, the standby driving signal generator 311 is activated in response to the overdriving start signal and outputs a standby control signal (scon). In response to the standby control signal, a standby driver 312 outputs the standby array power supply voltage (SIVCA). On the other hand, the active driving signal generator 321 inactivates the active control signal in response to the overdriving start signal, and an active driver 323 outputs the external array power supply voltage (VCCA) in response to the overdriving enable signal. Therefore, the external array power supply voltage VCCA is supplied as the array power supply voltage (VINTA).

When the sensing enable signal is activated in response to an active command (ACT) and a precharge period tRP1 is relatively short, the inactivation of the overdriving start signal occurs before the activation of the overdriving end signal. Thus, the overdriving enable signal is inactivated in response to the inactivation of the overdriving start signal. At the same time, the standby power supply voltage generator 310 stops the supply of the standby array power supply voltage. In response to the overdriving start signal, the active driving signal generator 321 activates the active control signal, and the active driver 323 applies the active array power supply voltage to the memory cell array. And, the ground driver 332 receives an external ground voltage (VSS) and supplies the array ground voltage (VSSA) to the memory cell array.

On the other hand, when a precharge period tRP2 is relatively long, the activation of the overdriving end signal occurs before the inactivation of the overdriving start signal. When the overdriving end signal is activated, the overdriving enable signal is inactivated and the overdriving operation is stopped. However, the overdriving start signal is still in an active state, and thus the standby power supply voltage generator 310 keeps supplying the standby array power supply voltage SIVCA. Therefore, even if the overdriving operation is stopped, the memory cell array maintains an overdriven voltage level due to the standby array power supply voltage SIVCA. After this, operation performed when the active command ACT is applied is the same as described above.

Figure 5:
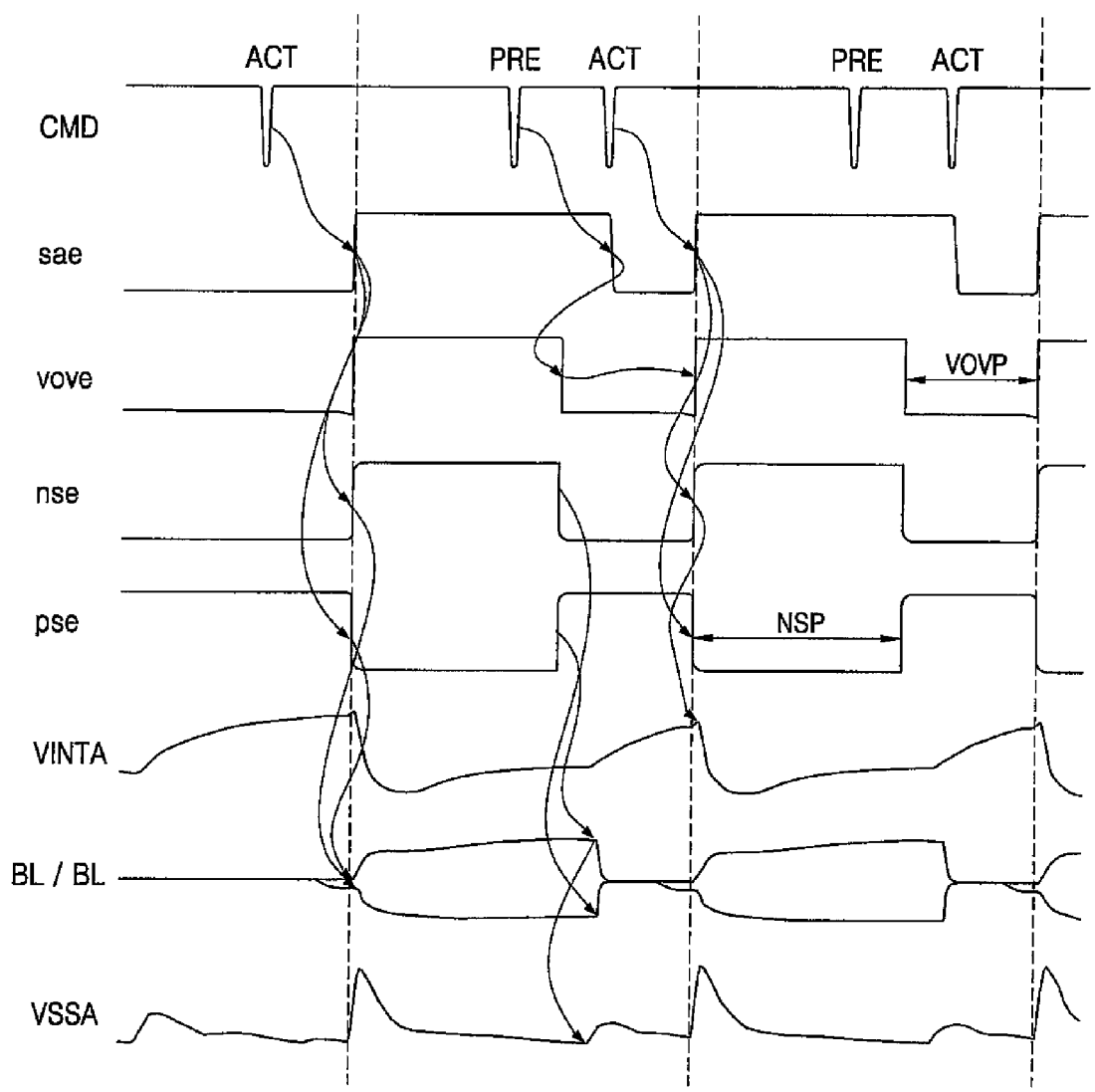
FIG. 5 is a timing diagram illustrating a sensing operation within a semiconductor memory device according to an embodiment of the invention.

FIG. 5 is a timing diagram illustrating a sensing operation adapted for use in semiconductor memory device according to an embodiment of the invention.

In FIG. 5, the sensing enable signal (sae) is activated in response to an active command (ACT) and inactivated in response to a precharge command (PRE). The overdriving enable signal (vove) is activated when the sensing enable signal is inactivated, and inactivated after a specific time when the sensing enable signal is activated. However, the overdriving enable signal is activated in response to the precharge command applied before the active command. As a result, the overdriving period (VOVP) depending on the overdriving enable signal is relatively long. In addition, since the precharge period tRP from when the precharge command is applied to when the active command is applied is not fixed, the overdriving enable signal has a variable pulse width. Thus, the overdriving period also varies.

The sensing operation adapted for use in a semiconductor memory device including an overdriving capability according to an embodiment of the invention will now be described with reference to FIG. 5. When an active command ACT is applied, the sensing enable signal is activated. The overdriving enable signal is activated before the sensing enable signal is activated, and inactivated after a specific time when the sensing enable signal is activated. The active driver 323 receives the overdriving enable signal activated before the sensing enable signal is activated, and supplies the external array power supply voltage (VCCA) as the array power supply voltage (VINTA). When the overdriving enable signal is inactivated after the specific time following the activation of the sensing enable signal, and the active control signal is activated, the active driver 323 supplies the active array power supply voltage (AIVCA) as the array power supply voltage to the memory cell array in response to the activated active control signal. The ground driver 332 supplies the array ground voltage (VSSA) to the memory cell array at all times. Meanwhile, after a specific time following the activation of the sensing enable signal, a P sensing signal (pse) and an N sensing signal (nse) are activated. When sensing drivers MP and MN are activated in response to the P sensing signal and the N sensing signal, and the array power supply voltage and the array ground voltage are applied to a sense amplifier SA, the sense amplifier SA amplifies a voltage difference between a pair of bit lines BL and /BL.

When the precharge command is applied, the sensing enable signal is inactivated. In response to the inactivated sensing enable signal, the P sensing signal and the N sensing signal are inactivated, and the sense amplifier SA stops its sensing operation. Meanwhile, the overdriving enable signal is activated in response to the inactivated sensing enable signal. Thus, the active driver 323 applies the external array power supply voltage to the memory cell array, thereby performing the overdriving operation. When the overdriving operation starts, the external power supply voltage is applied as the array power supply voltage, and the array ground voltage is raised to a specific level and reduced. Here, the array ground voltage may include noise. However, the semiconductor memory device does not perform the sensing operation in response to the precharge command and thus does not malfunction due to such noise. After a specific time, the array power supply voltage is maintained at the stable external power supply voltage. Since the array power supply voltage is stably maintained, noise is also removed from the array ground voltage, and the array ground voltage is stably maintained. After this, as described above, an active command is applied, the overdriving period (VOVP) is finished, and both the array power supply voltage and the array ground voltage are stably maintained. According to the foregoing approach, the sense amplifier SA performs a stable sensing operation.

In FIG. 5, the overdriving enable signal is activated in response to the inactivation of the sensing enable signal, inactivated in response to the activation of the sensing enable signal, and thus has a relatively long pulse width. Therefore, the overdriving period can be set to be very long, and the sense amplifier SA performs its sensing operation in a condition where noise is removed from the array power supply voltage and the array ground voltage. However, there is no difference in the period in which the sense amplifier SA amplifies a voltage difference between the pair of bit lines BL and /BL. Rather, the sensing period (NSP) may be lengthened by advancing the timing of the end of overdriving because overdriving has been already performed and the array power supply voltage and the array ground voltage are stably maintained. Also, a RAS-to-CAS delay time (tRCD) characteristic can be improved by advancing the timing of the P sensing signal and the N sensing signal.

In the foregoing description, the active driver 323 outputs the active array power supply voltage (AIVCA) or the external array power supply voltage (VCCA) in response to the active control signal or the overdriving enable signal, but an overdriver that outputs the external array power supply voltage (VCCA) in response to the overdriving enable signal may be additionally included. When the additional overdriver is included, it is possible to adjust the level of the external array power supply voltage (VCCA) differently from the external power supply voltage (VCC) and output it.

According to illustrated embodiments of an internal voltage generator and overdriving method for a semiconductor memory device, an overdriving signal may be activated in response to a precharge signal. Thus, it is possible to lengthen an overdriving period. A sense amplifier performs its sensing operation in a condition where noise is removed from an array power supply voltage and an array ground voltage, so that the semiconductor memory device can stably operate. In addition, since an overdriving operation is performed in advance of an active operation, it is possible to increase the operating speed of the semiconductor memory device.

While example embodiments have been disclosed herein, it should be understood that other variations may be possible. Such variations are not to be regarded as a departure from the scope of the invention, and all such modifications are intended to be included within the scope of the following claims.

What is claimed is:

1. A semiconductor memory device, comprising:
a memory cell array; and
an internal voltage generator configured to supply an array power supply voltage to the memory cell array, the internal voltage generator adjusting the array power supply voltage to a first voltage when a sensing enable signal is inactivated and adjusting the array power supply voltage to a second voltage lower than the first voltage when the sensing enable signal is activated,
wherein, when a time period from a point when the sensing enable signal is inactivated to a point when the sensing enable signal is activated is shorter than or equal to a first delay time, the internal voltage generator adjusts the array power supply voltage to the first voltage from a first point when the sensing enable signal is inactivated to a second point when a second delay time elapsed after the sensing enable signal is activated, and adjusts the array power supply voltage to the second voltage from the second point.

2. The semiconductor memory device of claim 1, wherein the first voltage is an external array power supply voltage, and the second voltage is an active array power supply voltage.

3. The semiconductor memory device of claim 1, wherein the internal voltage generator comprises:

a control signal generator configured to generate a control signal in response to the sensing enable signal; and a first voltage generator configured to output the first voltage or the second voltage as the array power supply voltage in response to the control signal.

4. A semiconductor memory device, comprising:

a memory cell array; and an internal voltage generator configured to supply an array power supply voltage to the memory cell array, the internal voltage generator adjusting the array power supply voltage to a first voltage when a sensing enable signal is inactivated and adjusting the array power supply voltage to a second voltage lower than the first voltage when the sensing enable signal is activated, wherein, when a time period from a point when the sensing enable signal is inactivated to a point when the sensing enable signal is activated is longer than a first delay time, the internal voltage generator adjusts the array power supply voltage to the first voltage from a first point when the sensing enable signal is inactivated to a second point when the first delay time elapsed after the sensing enable signal is inactivated, adjusts the array power supply voltage to a third voltage lower than the first voltage and higher than the second voltage from the second point to a third point when a second delay time elapsed after the sensing enable signal is activated, and adjust the array power supply voltage to the second voltage from the third point.

5. The semiconductor memory device of claim 4, wherein the first voltage is an external array power supply voltage, the second voltage is an active array power supply voltage, and the third voltage is a standby array power supply voltage.

6. The semiconductor memory device of claim 4, wherein the first delay time is longer than the second delay time.

7. A semiconductor memory device, comprising:

a memory cell array; and an internal voltage generator configured to supply an array power supply voltage to the memory cell array, the internal voltage generator adjusting the array power supply voltage to a first voltage when a sensing enable signal is inactivated and adjusting the array power supply voltage to a second voltage lower than the first voltage when the sensing enable signal is activated, wherein the internal voltage generator comprises a control signal generator configured to generate a control signal in response to the sensing enable signal, and a first voltage generator configured to output the first voltage or the second voltage as the array power supply voltage in response to the control signal, and wherein the control signal comprises an overdriving start signal and an overdriving enable signal, and the control signal generator immediately activates the overdriving start signal and the overdriving enable signal when the sensing enable signal is inactivated, and inactivates the overdriving start signal and the overdriving enable signal from a point when a first delay time elapsed after the sensing enable signal is activated when the sensing enable signal is activated.

8. The semiconductor memory device of claim 7, wherein the first voltage generator outputs the first voltage as the array power supply voltage when the overdriving start signal and the overdriving enable signal are activated, and outputs the second voltage as the array power supply voltage when the overdriving start signal and the overdriving enable signal are inactivated.

9. The semiconductor memory device of claim 7, wherein, when a time period from a point when the sensing enable signal is inactivated to a point when the sensing enable signal is activated is longer than a second delay time, the control signal generator inactivate the overdriving enable signal from a point when the second delay time elapsed after the sensing enable signal is inactivated to a point when the first delay time elapsed after the sensing enable signal is activated.

10. The semiconductor memory device of claim 9, wherein the first voltage generator outputs the first voltage as the array power supply voltage when the overdriving start signal and the overdriving enable signal are activated, outputs the second voltage as the array power supply voltage when the overdriving start signal and the overdriving enable signal are inactivated, and is disabled when the overdriving start signal is activated and the overdriving enable signal is inactivated.

11. The semiconductor memory device of claim 10, further comprising:

a second voltage generator configured to output a third voltage lower than the first voltage and higher than the second voltage as the array power supply voltage when the overdriving start signal is activated, and is disabled when the overdriving start signal is inactivated.

12. A semiconductor memory device, comprising:

a memory cell array; and an internal voltage generator configured to supply an array power supply voltage to the memory cell array, the internal voltage generator adjusting the array power supply voltage to a first voltage when a sensing enable signal is inactivated and adjusting the array power supply voltage to a second voltage lower than the first voltage when the sensing enable signal is activated, wherein the memory cell array comprises:

a plurality of memory cells connected to each of a pair of bit lines; and a sense amplifier connected to the pair of bit lines, and wherein the array power supply voltage is supplied to the sense amplifier.

13. A semiconductor memory device, comprising:

a memory cell array;

an internal voltage generator configured to supply an array power supply voltage to the memory cell array, the internal voltage generator adjusting the array power supply voltage to a first voltage when a sensing enable signal is inactivated and adjusting the array power supply voltage to a second voltage lower than the first voltage when the sensing enable signal is activated, and a controller configured to activate the sensing enable signal when an active command is applied, inactivate the sensing enable signal when a precharge command is applied, and output the sensing enable signal.

* * * * *